(12) United States Patent
Sheen

(10) Patent No.: US 6,455,929 B1
(45) Date of Patent: Sep. 24, 2002

(54) EMBEDDED TYPE PACKAGE OF POWER SEMICONDUCTOR DEVICE

(75) Inventor: C. G. Sheen, Taoyuan (TW)

(73) Assignee: Actron Technology Corporation, Taoyuan (TW)

( * ) Notice: Subject to any disclaimer, the term of this patent is extended or adjusted under 35 U.S.C. 154(b) by 0 days.

(21) Appl. No.: 09/873,221

(22) Filed: Jun. 5, 2001

(51) Int. Cl.⁷ .............................................. H01L 29/72
(52) U.S. Cl. ...................... 257/690; 257/692; 257/693; 257/694; 257/699; 257/707
(58) Field of Search ................................. 257/690, 692, 257/693, 694, 699, 707

(56) References Cited

U.S. PATENT DOCUMENTS 5,656,864 A * 8/1997 Mitsue et al. ................ 257/787

* cited by examiner

Primary Examiner—Edward Wojciechowicz
(74) Attorney, Agent, or Firm—Rosenberg, Klein & Lee

(57) ABSTRACT

An embedded type package of power semiconductor device comprises a semiconductor device and a cup. One side of the semiconductor device is connected to a leader and another side of the semiconductor device is connected to the cup. The cup has guiding bevel and annulus groove on bottom side thereof. The cup further has an embedding part on outer side thereof and having two slantingly planes. The cup further comprises a heatsink connected to the semiconductor device; and a cone-shaped inner wall bordered to the heatsink and having a mold lock.

6 Claims, 5 Drawing Sheets

EMBEDDED TYPE PACKAGE OF POWER SEMICONDUCTOR DEVICE

FIELD OF THE INVENTION

The present invention relates to an embedded type package of power semiconductor device, especially to an embedded type package of power semiconductor device, which can prevent crack and misalignment problem and is advantageous for high temperature operation.

BACKGROUND OF THE INVENTION

The electronic apparatus employing power semiconductor devices requires high-density assembling and excellent heatsink. Therefore, embedded type packages are developed for power semiconductor devices such as high power rectifiers. For example, in automobile, 6 to 8 power rectifiers are used in an AC generator.

FIG. 1 shows a prior art embedded type package in U.S. Pat. No. 5,005,068 disclosed by Wasmer and issued in Apr. 2, 1991. The embedded type package 1a comprises a nailhead 11a and a cup 12a and a semiconductor dice 13a therebetween. The semiconductor dice 13a is covered with passivant 14a on the perimeter thereof. The cup 12a has a mold lock 15a on top surface thereof and the cavity formed by the wall 16a is filled with encapsulant 17a.

As shown in this figure, the embedded type package 1a is subjected to an axial force 18a such that the aluminum plate 19a and the cup 12a are coupled by compression fit. Therefore, the aluminum plate 19a and the cup 12a do not require mechanical and electrical contact through solder or other binder.

However, in above-mentioned embedded type package 1a, the semiconductor dice 13a has the risk of crack. More particularly, the semiconductor dice 13a has locally high stress on one corner or a plurality of corners thereof when a radial force 20 is applied. The problem of crack is worse after several post processes are performed.

The above-mentioned embedded type package 1a further has the problem of misalignment. More particularly, the embedded type package 1a may be aligned in wrong direction before the embedding force is applied. The embedded type package 1a and the aluminum plate 19a have no optimal contact therebetween. The package weight, center of gravity, and shape of the embedded type package 1a are influenced.

Moreover, the above-mentioned embedded type package 1a further has the problem of thermal mechanical fatigue. The semiconductor dice 13a has fatigue after repeated cold- and hot-temperature treatment.

Moreover, some embedded type package 1a employs plastic package to overcome above problem. However, the plastic package is not suitable for high-temperature or high humidity environment.

SUMMARY OF THE INVENTION

It is the object of the present invention to provide an embedded type package of power semiconductor device, which can prevent crack and misalignment problem and is advantageous for high temperature operation.

To achieve above object, the present invention provides an embedded type package of power semiconductor device having a semiconductor device and a cup. One side of the semiconductor device is connected to a leader and another side of the semiconductor device is connected to the cup. The cup has guiding bevel and annulus groove on bottom side thereof. The cup further has an embedding part on outer side thereof. The cup further comprises a heatsink connected to the semiconductor device; and a cone-shaped inner wall bordered to the heatsink and having a mold lock higher than the semiconductor device.

The various objects and advantages of the present invention will be more readily understood from the following detailed description when read in conjunction with the appended drawing, in which:

DETAILED DESCRIPTION OF THE INVENTION

Figure 1:
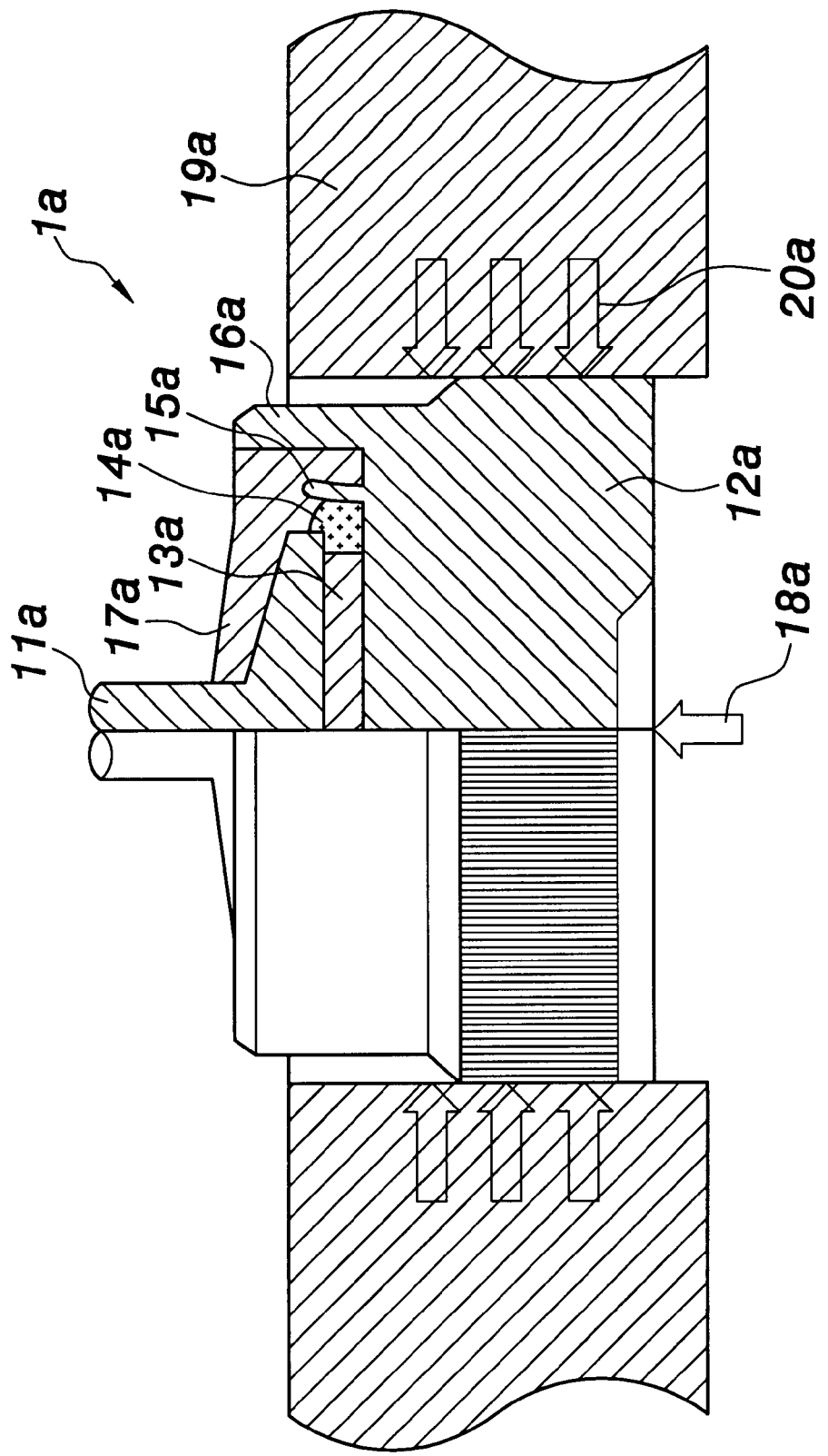
FIG. 1 shows the sectional view of prior art embedded type package.
Figure 2:
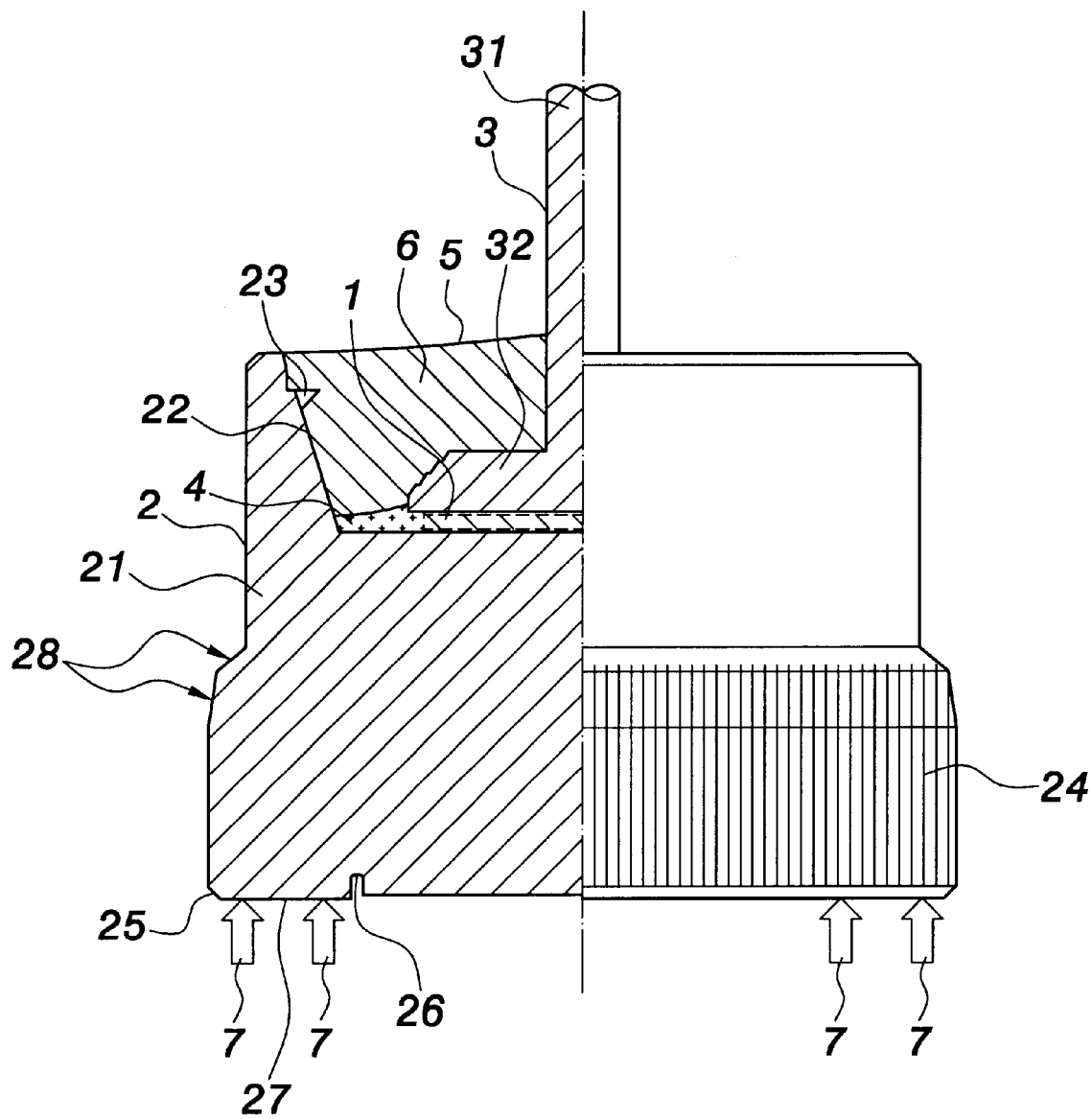
FIG. 2 shows the partial sectional view of embedded type package of the present invention.

FIG. 2 shows the sectional view of the present invention. The present invention provides an embedded type package of power semiconductor device, which comprises a dice 1 and a cup 2.

The semiconductor dice 1 can be various kind of semiconductor device and is connected to a leader 3 by solder to provide electrical and mechanical connection. In the preferred embodiment of the present invention, the solder can be lead-based soft solder with high melting point. The leader 3 is made of copper with high purity or other conductive materials. The leader 3 is composed of an axial lead 31 and a nailhead 32 to provide conductive path for the semiconductor dice 1. For example, in a silicon rectifier, the axial lead 31 is functioned as the cathode or anode of the silicon rectifier. The nailhead 32 can be of various shapes such as circular shape, hexagonal shape or square shape and is extruding in comparison with the semiconductor dice 1.

Moreover, the semiconductor dice 1 can be used to achieve P-N junction diode with cathode and anode. In the present invention, rectifier and diode are interchangeably used.

The semiconductor dice 1 can also use other material than silicon, such as Ge and Si in group IV semiconductor, GaAs and AlGaAs in group III–V semiconductor, and other materials such as SiC, or sapphire.

The semiconductor dice 1 is covered by insulative materials such as passivant 4 on the exposed peripheral thereof to protect the semiconductor dice 1 from dirt and moisture. In a preferred embodiment of the present invention, the semiconductor dice 1 is an open-junction rectifier and the passivant 4 can use silicon rubber or polyimide.

Figure 2A:
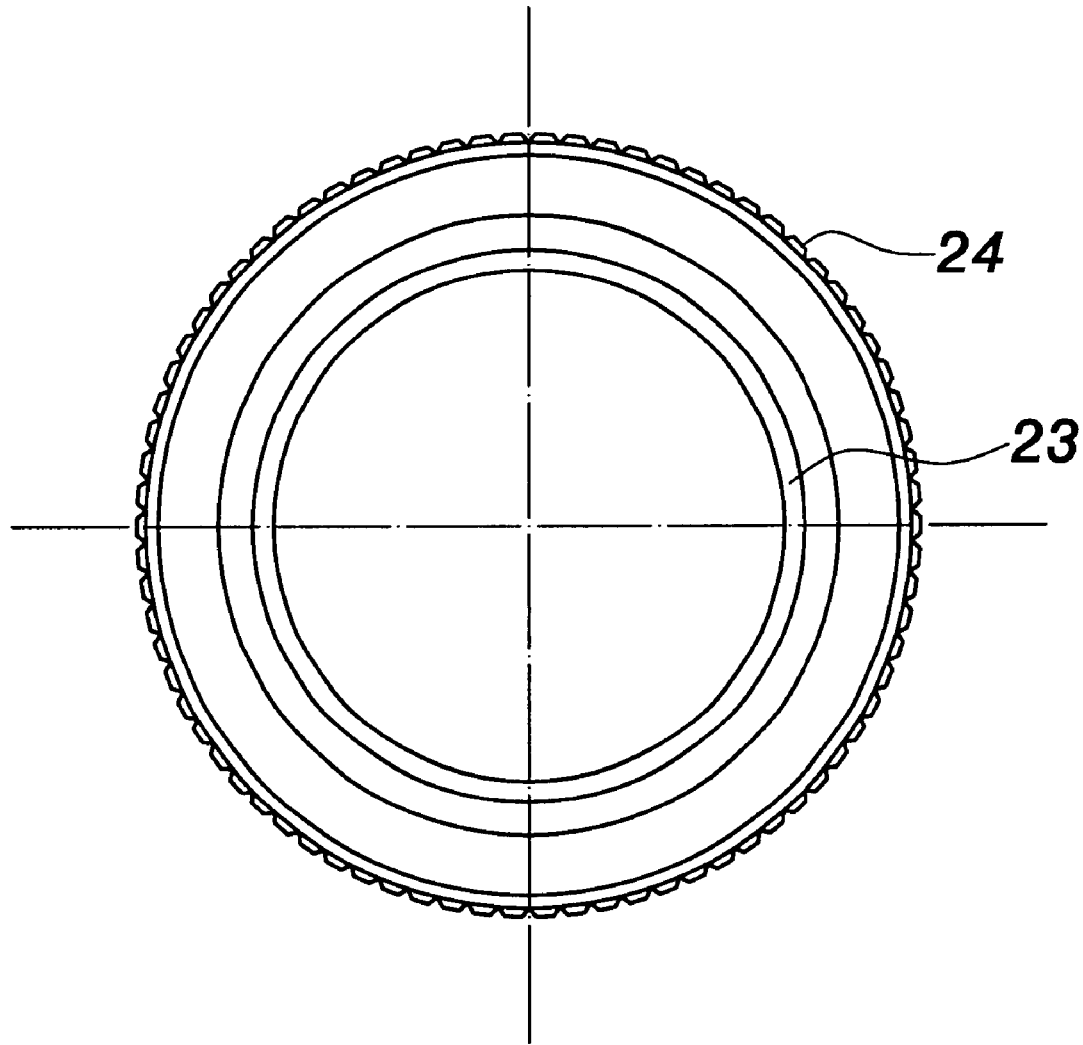
FIG. 2A shows the top view of one kind of mold lock of the present invention.
Figure 2B:
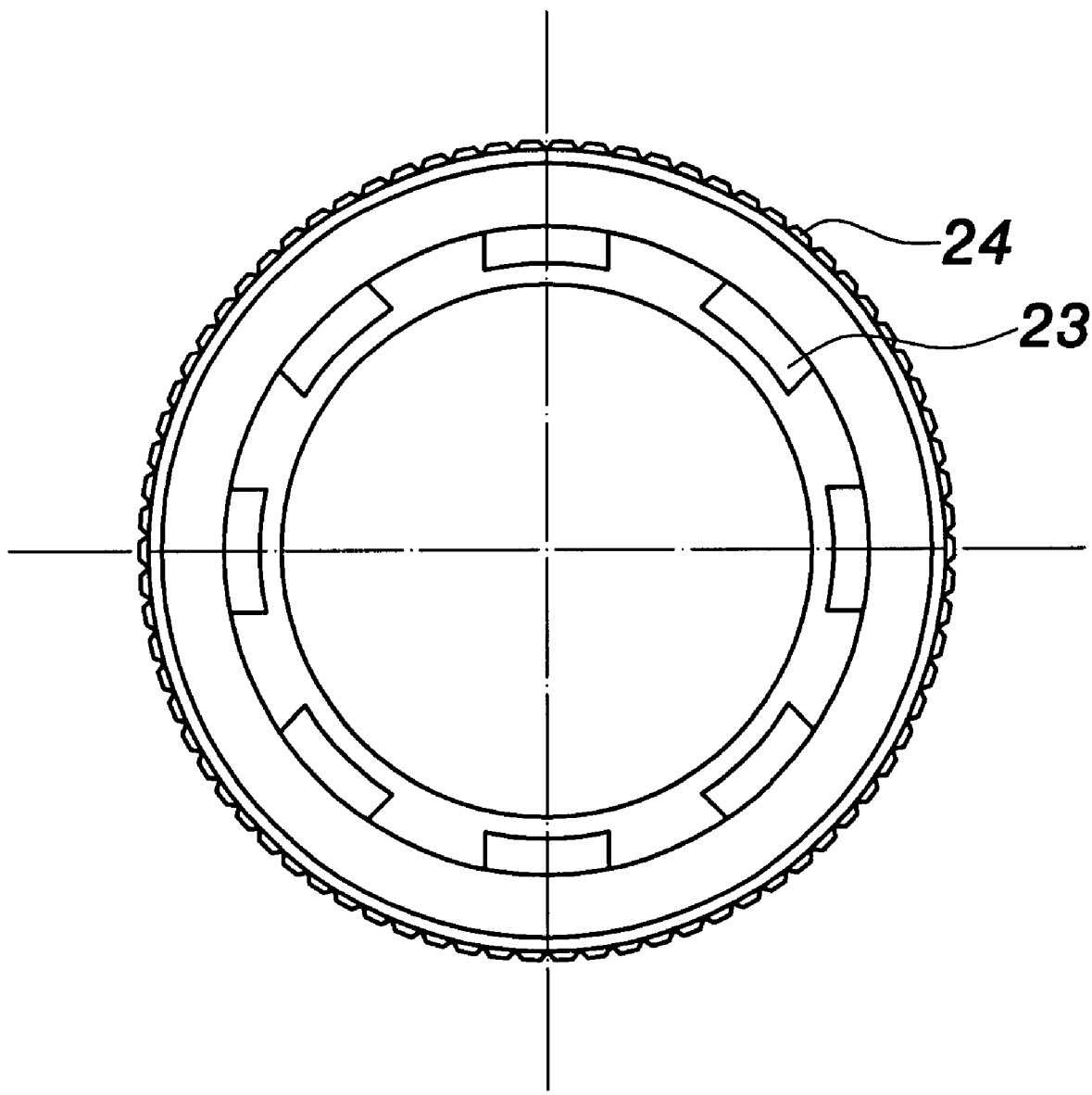
FIG. 2B shows the top view of another kind of mold lock of the present invention.

The cup 2 is composed of a heatsink 21 and a cone-shaped inner wall 22. The heatsink 21 is connected to the semiconductor dice 1 and the cone-shaped inner wall 22 is bordered to the heatsink 21 at the topside of the heatsink 21. The cone-shaped inner wall 22 has a mold lock 23 higher than the semiconductor dice 1. The mold lock 23 can be continuous ring as shown in FIG. 2A or a plurality of non-overlapping arcs as shown in FIGS. 2B. The mold lock 23 has slanting bottom side to form triangular cross section.

Moreover, a cavity 5 with opened topside is provided among the cone-shaped inner wall 22, the heatsink 21, the semiconductor dice 1 and the leader 3. The cavity 5 is filled with encapsulant 6 after the passivant 4, the semiconductor dice 1 and the leader 3 are assembled. The encapsulant 6 fixes those elements in the cavity 5 and prevents dirt from contaminating the active region of the semiconductor dice 1. The encapsulant 6 can use various materials such as epoxy. Moreover, the mold lock 23 is placed below the top of the encapsulant 6 and above the topside of the semiconductor dice 1. The encapsulant 6 is advantageously retained and the mechanical fatigue is reduced.

The outer surface of the cup 2, especially the portion of the heatsink 21 has a roller steak region 24 to facilitate the compression fit between the package and an aluminum plate (not shown).

Figure 2C:
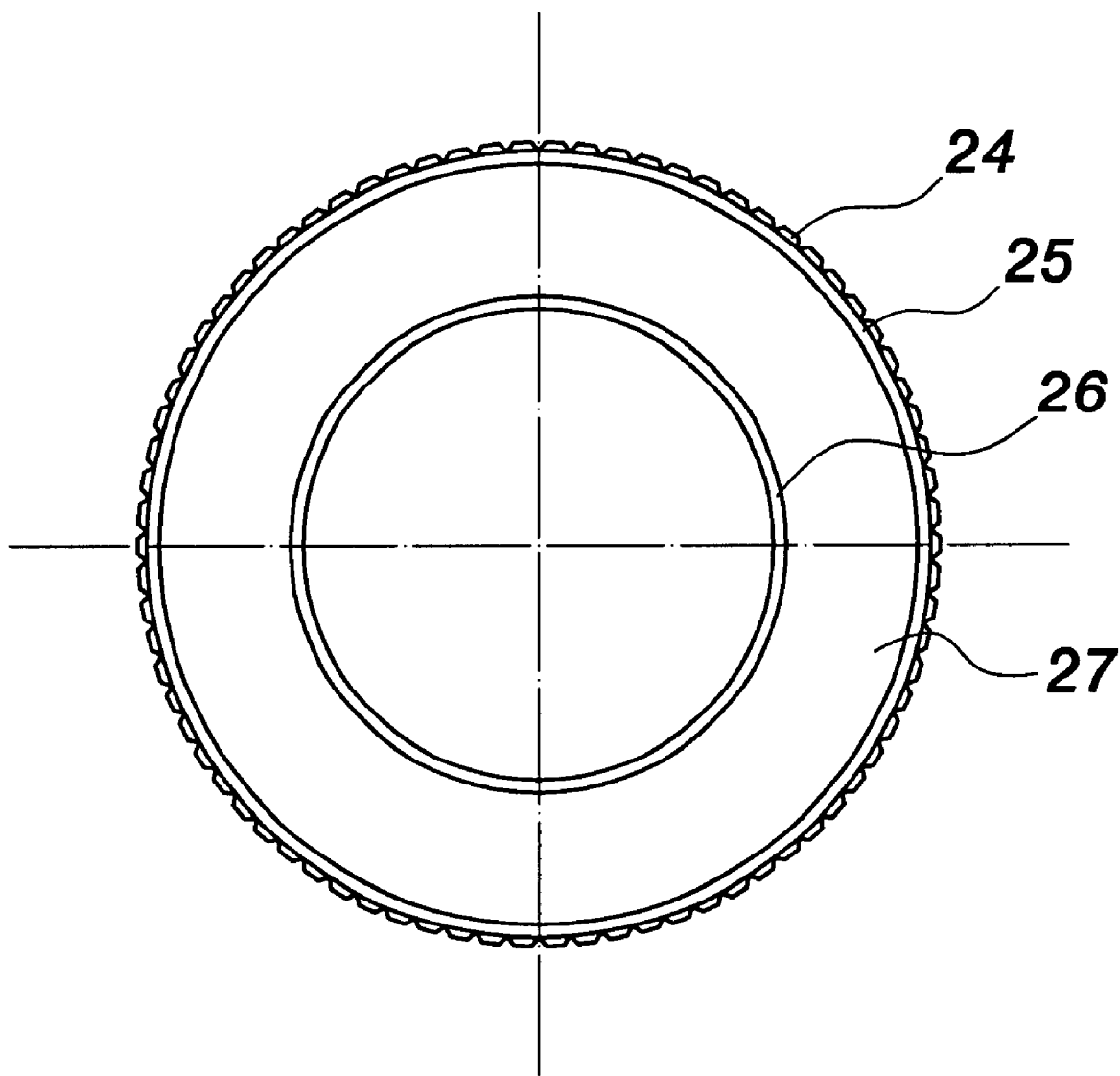
FIG. 2C shows the bottom view of the present invention.

As shown in FIG. 2C, the cup 2 has guiding bevel 25 and annulus groove 26 on bottom thereof. Therefore, a large ring 27 is formed on outer side of the annulus groove 26. The cup 2 has an embedding part 28 on outer side thereof, the embedding part 28 has two slantingly planes to facilitate the alignment of the package in compression operation. Therefore, the outer side of the cup 2 is subjected to uniform force. The guiding bevel 25 and the ring 27 are helpful to reduce stress and the bevel on the inner wall of the cone-shaped inner wall 22 is also helpful to reduce inner stress of the package to prevent crack of the semiconductor dice 1.

To sum up, the embedded type package of power semiconductor device according to the present invention can prevent crack and misalignment problem and is advantageous for high temperature operation.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

I claim:

1. An embedded type package of power semiconductor device, comprising:

a semiconductor device, one side thereof connected to a leader;

a cup connected to another side of the semiconductor device and having guiding bevel and annulus groove on bottom side thereof, the cup further having an embedding part on outer side thereof and having two slantingly planes; the cup further comprising:

heatsink connected to the semiconductor device; and cone-shaped inner wall bordered to the heatsink and having a mold lock.

2. The embedded type package of power semiconductor device as in claim 1, wherein the semiconductor device is a semiconductor dice.

3. The embedded type package of power semiconductor device as in claim 1, wherein the semiconductor device is covered with insulative materials.

4. The embedded type package of power semiconductor device as in claim 1, wherein the material of the leader is copper.

5. The embedded type package of power semiconductor device as in claim 1, wherein the material of the cup is copper.

6. The embedded type package of power semiconductor device as in claim 1, wherein the mold lock is higher than the semiconductor device.

* * * * *